(12) United States Patent
Lee et al.

(10) Patent No.: US 7,439,541 B2
(45) Date of Patent: Oct. 21, 2008

(54) PIXEL STRUCTURE AND FABRICATING METHOD THEREOF

(75) Inventors: Yi-Wei Lee, Hsinchu (TW); Ching-Yun Chu, Hsinchu (TW); TzuFong Huang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 89 days.

(21) Appl. No.: 11/675,639

(22) Filed: Feb. 16, 2007

(65) Prior Publication Data
US 2008/0111935 A1    May 15, 2008

(30) Foreign Application Priority Data
Nov. 9, 2006    (TW) ............................ 95141458 A

(51) Int. Cl.
*H01L 29/04* (2006.01)
(52) U.S. Cl. ................... 257/59; 257/E31.126

(58) Field of Classification Search ............. 257/59, 257/82–83, 184, 98, 257, 72, 290, 368
See application file for complete search history.

(56) References Cited

U.S. PATENT DOCUMENTS 5,510,918 A * 4/1996 Matsunaga et al. .......... 349/149
6,433,842 B1 * 8/2002 Kaneko et al. .............. 349/43

* cited by examiner

*Primary Examiner*—Wai-Sing Louie
*Assistant Examiner*—Bilkis Jahan
(74) *Attorney, Agent, or Firm*—Jianq Chyun IP Office

(57) ABSTRACT

A pixel structure including a substrate, a gate, a patterned dielectric layer, a semiconductor layer, a source, a drain and a reflective pixel electrode is provided. The gate is disposed on the substrate, whereon the patterned dielectric layer is disposed to cover the gate. The patterned dielectric layer has a plurality of bumps and at least one opening; the bumps are disposed on the substrate exposed by the opening and the semiconductor layer is disposed on the patterned dielectric layer above the gate. The source and the drain are disposed on the semiconductor layer. The reflective pixel electrode is disposed on the patterned dielectric layer to cover the bumps and electrically connected with the drain. Hence, the pixel structure can achieve better reliability.

12 Claims, 4 Drawing Sheets

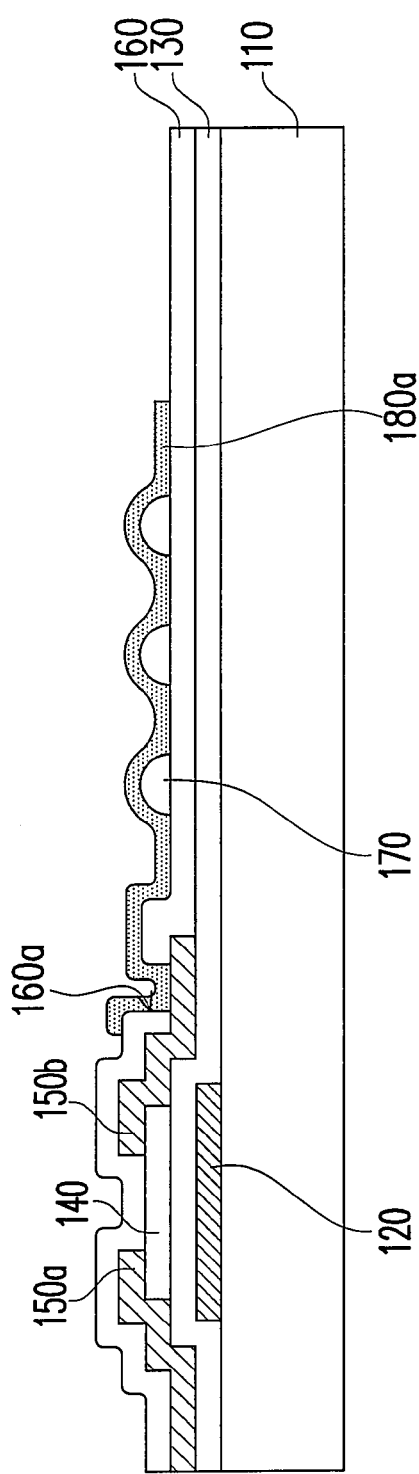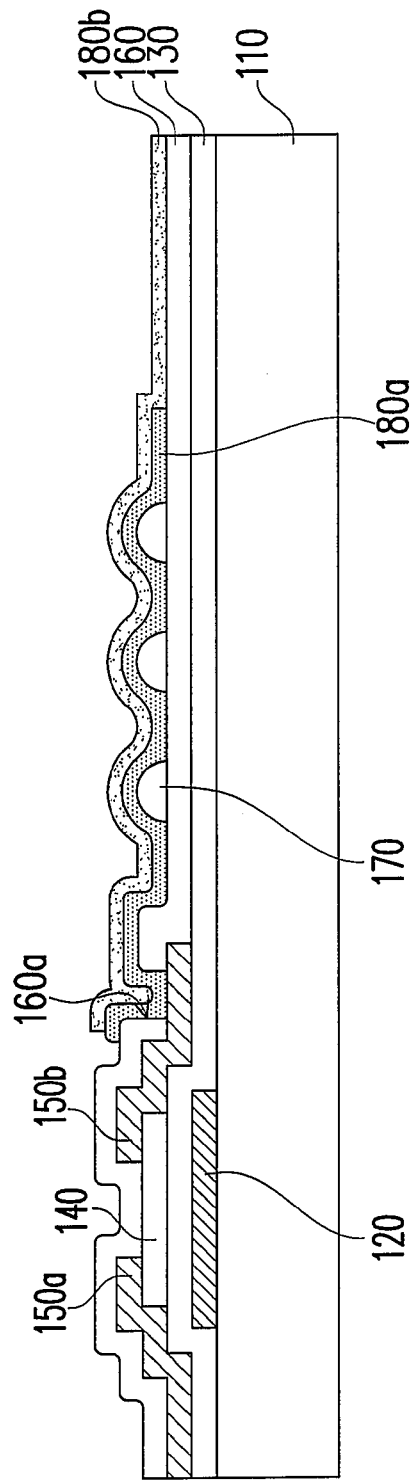
FIG. 1C (PRIOR ART)
FIG. 1D (PRIOR ART)

PIXEL STRUCTURE AND FABRICATING METHOD THEREOF

CROSS-REFERENCE TO RELATED APPLICATION

This application claims the priority benefit of Taiwan application serial no. 95141458, filed Nov. 9, 2007. All disclosure of the Taiwan application is incorporated herein by reference.

BACKGROUND OF THE INVENTION

1. Field of the Invention

The present invention relates to a pixel structure and a fabricating method thereof, and particularly to a pixel structure for use in a liquid crystal display (LCD) device and a method of fabricating the same.

2. Description of Related Art

Thin film transistor liquid crystal displays are generally classified into three types, namely, the transmissive type, the reflective type and the transflective type. This classification is based on the light sources utilized and the differences in the array substrate. The transmissive type thin film transistor liquid crystal display (transmissive TFT-LCD) device mainly utilizes a back-light as the light source. The pixel electrodes on the thin film transistor array substrate are transparent electrodes to facilitate the penetration of light from the back-light source. The reflective thin film transistor liquid crystal display (reflective TFT-LCD) device mainly utilizes a front-light or an external light as its light source. The pixel electrodes on the thin film transistor array substrate are reflective metal electrodes or other reflective electrodes with good reflection properties suitable for reflecting light from the front-light source or the external light source. On the other hand, the transflective thin film transistor liquid crystal display (transflective TFT-LCD) device can be regarded as a structure that integrates both the transmissive TFT-LCD device and the reflective TFT-LCD device. The transflective TFT-LCD device can utilize both a back-light source and a front-light source or an external light source simultaneously to display images.

FIGS. 1A to 1D are cross-sectional views showing the conventional fabrication flowchart of a pixel structure used in the transflective LCD device. Referring to FIG. 1A, the conventional fabricating process of the pixel structure includes the following steps. First, a substrate 110 is provided, whereon a gate 120, a gate insulation layer 130, a semiconductor layer 140, a source 150a and a drain 150b are formed in order. The gate 120 is covered by the gate insulation layer 130. The semiconductor layer 140 is disposed on the gate insulation layer 130 above the gate 120. The source 150a and the drain 150b are disposed on the semiconductor layer 140.

Referring to FIG. 1B, a protective layer 160, formed on the gate insulation layer 130, has a contact hole 160a to expose a portion of the drain 150b. Next, a plurality of bumps 170 is formed on the protective layer 160. More specifically, a patterned photo-resistant layer (not shown) is formed on the protective layer 160, and then a reflowing process is performed to form the bumps 170.

Referring to FIGS. 1C and 1D, a reflective pixel electrode 180a and a transparent pixel electrode 180b are formed in order over the protective layer 160. The reflective pixel electrode 180a covers the bumps 170 and is electrically connected with the drain 150b through the contact hole 160a. Moreover, the transparent pixel electrode 180b covers the reflective pixel electrode 180a and is electrically connected with the drain 150b through the reflective pixel electrode 180a.

Since the reflective pixel electrode 180a covers the bumps 170, the light reflection rate can be increased. However, because the bumps 170 are made of a photo-resistant material and the photo-resistant material contains solvents, the bumps 170 may result in low reliability. Besides, the bumps 170 also introduce an additional cost.

SUMMARY OF THE INVENTION

In view of the above, the present invention provides a pixel structure to increase reliability.

Additionally, the invention further provides a fabricating method of the pixel structure to simplify the fabricating process.

The invention provides a pixel structure, which includes a substrate, a gate, a first patterned dielectric layer, a semiconductor layer, a source, a drain and a reflective pixel electrode. The gate is disposed on the substrate, whereon the first patterned dielectric layer is disposed to cover the gate. The first patterned dielectric layer has a plurality of bumps and at least one opening. The bumps are disposed on the substrate exposed by the opening. The semiconductor layer is disposed on the first patterned dielectric layer above the gate. The source and the drain are disposed on the semiconductor layer. The reflective pixel electrode is disposed on the first patterned dielectric layer to cover the bumps and electrically connected with the drain.

In one embodiment of the invention, each of the bumps has a top surface, a bottom surface and at least one side surface, which is connected with the top surface and the bottom surface.

In one embodiment of the invention, the width of each of the bumps is gradually decreased from the bottom surface to the top surface.

In one embodiment of the invention, the distance between the top surface and the bottom surface of each of the bumps is between 2500 and 4000 angstroms.

In one embodiment of the invention, the angle between the side surface and the bottom surface of each of the bumps is from 10 to 15 degrees.

In one embodiment of the invention, the width of the bottom surface of each of the bumps is between 3.5 and 5 microns.

In one embodiment of the invention, the pixel structure further includes a second patterned dielectric layer and a transparent pixel electrode. The second patterned dielectric layer is disposed on the first patterned dielectric layer to cover the bumps, the source and the reflective pixel electrode. Moreover, the second patterned dielectric layer has a contact hole, which exposes a portion of the drain. The transparent pixel electrode is disposed on the second patterned dielectric layer and electrically connected with the drain through the contact hole.

In one embodiment of the invention, the pixel structure further includes an ohmic contact layer, which is disposed between the semiconductor layer and the source and between the semiconductor layer and the drain.

The invention provides a fabricating method of a pixel structure including the following steps. First, a substrate is provided, whereon a gate is formed. A first patterned dielectric layer is formed over the substrate to cover the gate, and the first patterned dielectric layer has a plurality of bumps and at least one opening. The bumps are disposed on the substrate exposed by the opening. Afterwards, a semiconductor layer is formed on the first patterned dielectric layer, wherein the semiconductor layer is disposed on the first patterned dielectric layer above the gate. Next, a source, a drain and a reflective pixel electrode are formed over the first patterned dielectric layer, wherein a portion of the semiconductor layer is covered by the source and the drain. The reflective pixel electrode is electrically connected with the drain and covers the bumps.

In one embodiment of the invention, after the source, the drain and the reflective pixel electrode are formed, the fabricating method of the pixel structure further includes that a second patterned dielectric layer is formed on the first patterned dielectric layer to cover the bumps, the source and the reflective pixel electrode. The second patterned dielectric layer has a contact hole, which exposes a portion of the drain. Afterwards, a transparent pixel electrode is formed on the second patterned dielectric layer, and the transparent pixel electrode is electrically connected with the drain through the contact hole.

In one embodiment of the invention, the steps of forming a semiconductor layer include forming a semiconductor material layer on the first patterned dielectric layer. The semiconductor material layer is then patterned to form the semiconductor layer.

In one embodiment of the invention, after the semiconductor material layer is formed, the fabricating method of the pixel structure further includes forming an ohmic contact material layer on the semiconductor material layer.

In view of the above, the first patterned dielectric layer having a plurality of bumps is formed in the invention, and the bumps are covered by the reflective pixel electrode to form a bumping surface. Hence, compared with the prior art, the fabricating process of the present invention not only is simpler, but the pixel structure thus formed has better reliability.

In order to the make the aforementioned and other objects, features and advantages of the present invention more comprehensible, some preferred embodiments accompanied with figures are described in detail below.

BRIEF DESCRIPTION OF THE DRAWINGS

FIGS. 1A to 1D are cross-sectional views illustrating the conventional fabrication flowchart of a pixel structure used in the transflective LCD device.

DESCRIPTION OF EMBODIMENTS

Figure 1A:
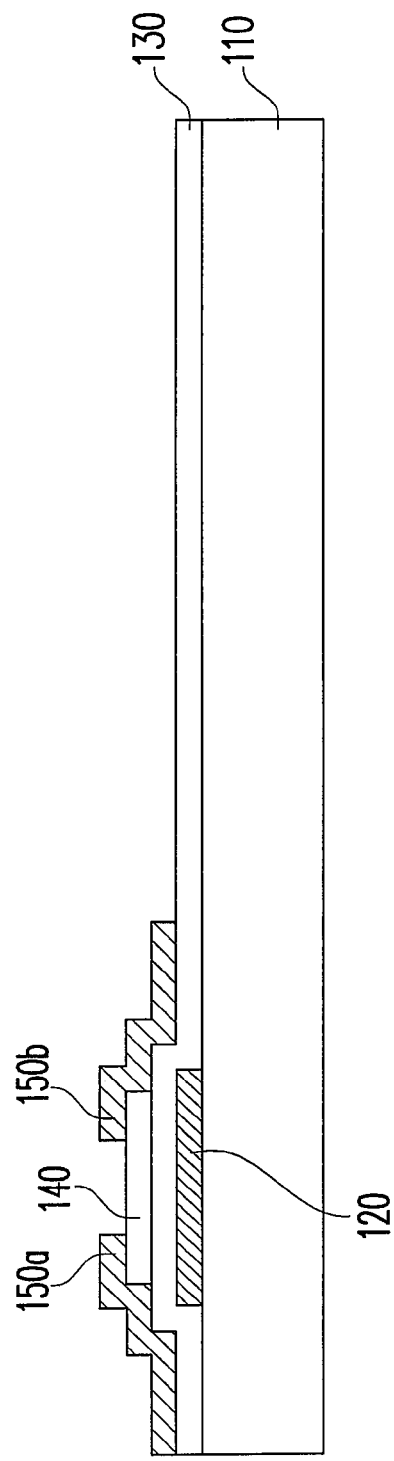
Figure 1B:
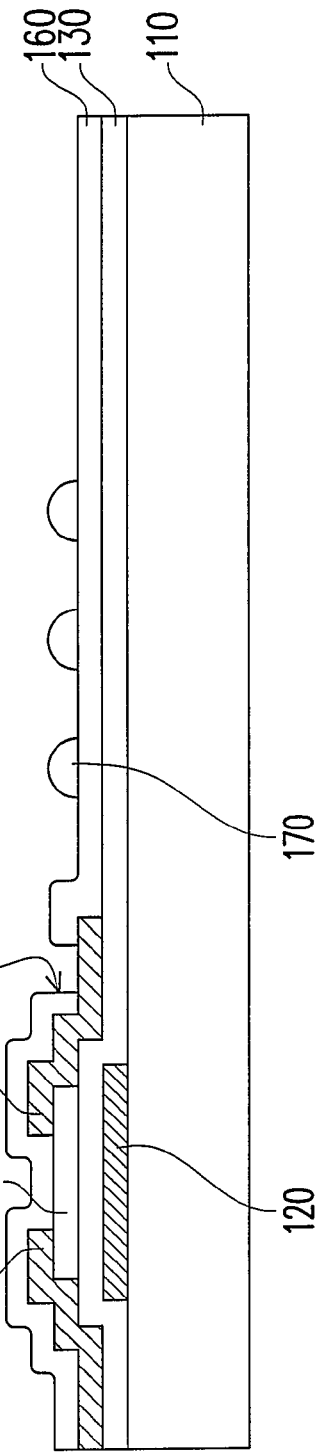
Figure 2A:
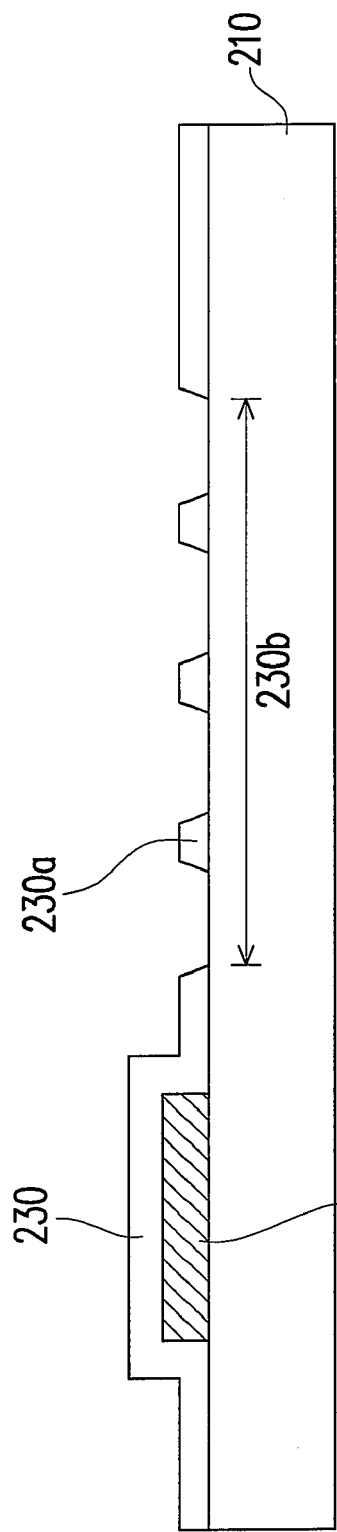
FIGS. 2A to 2C are schematic diagrams of the fabricating method of a pixel structure according to one embodiment of the invention.

Referring to FIG. 2A, the fabricating method of a pixel structure according to the present embodiment includes the following steps. First, a substrate 210 is provided, whereon a gate 220 is formed. More specifically, a first conductive layer (not shown) is formed first on the substrate 210, and then a patterning process is performed to form a gate 220. Next, a first patterned dielectric layer 230, formed over the substrate 210 to cover the gate 220, has a plurality of bumps 230a and at least one opening 230b. The bumps 230a are disposed on the substrate 210 exposed by the opening 230b. The bumps 230a may be arranged in random or in a predetermined specification. More specifically, a first dielectric layer (not shown) is formed first over the substrate 210. A patterning process is then performed on the first dielectric layer to form the bumps 230a. Additionally, the patterning process includes a photolithography process and an etching process. Besides, the method for forming the first dielectric layer may be a plasma enhanced chemical vapor deposition (PECVD) process performed below the temperature 300° C., for example.

Figure 2B:
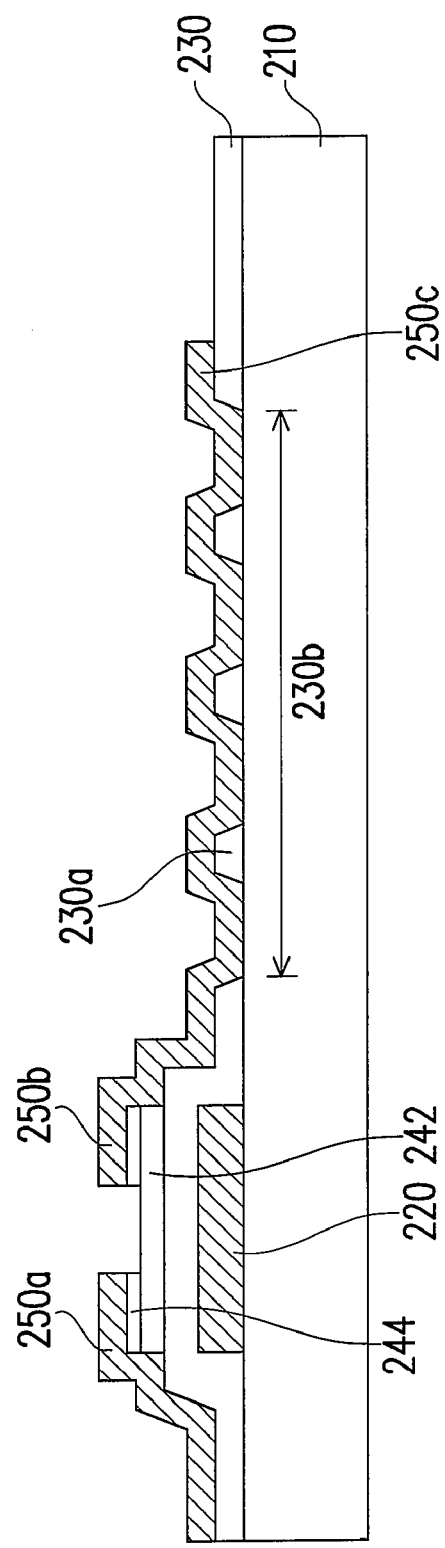

Referring to FIG. 2B, a semiconductor layer 242 is formed on the first patterned dielectric layer 230, wherein the semiconductor layer 242 is disposed on the first patterned dielectric layer 230 above the gate 220. More specifically, a semiconductor material layer (not shown) is formed on the first patterned dielectric layer 230, and then a patterning process is performed to form the semiconductor layer 242. Furthermore, in order to increase electrical quality, after the semiconductor material layer is formed, an ohmic contact material layer (not shown) is subsequently formed thereon. Preferably, a patterning process is performed on the semiconductor material layer and the ohmic contact material layer to form an ohmic contact layer 244 on the semiconductor layer 242.

Referring still to FIG. 2B, a source 250a, a drain 250b and a reflective pixel electrode 250c are formed over the first patterned dielectric layer 230. A portion of a semiconductor layer 244a is covered by the source 250a and the drain 250b. The reflective electrode 250c is electrically connected with the drain 250b, and covers the bumps 230a. More specifically, a second conductive layer (not shown) is first formed on the first patterned dielectric layer 230, and then is patterned to form the source 250a, the drain 250b and the reflective pixel electrode 250c. Further, after the source 250a and the drain 250b are formed, a back channel etching (BCE) process using the source 250a and the drain 250b as a mask is performed to remove the ohmic contact layer 244 between the source 250a and the drain 250b. It is noted that the pixel structure formed by the foregoing fabricating process can be used in the reflective LCD device. Nevertheless, other steps may be further carried out in the present embodiment to form the pixel structure for use in the transflective LCD device. Those steps are described in detail as follows.

Figure 2C:
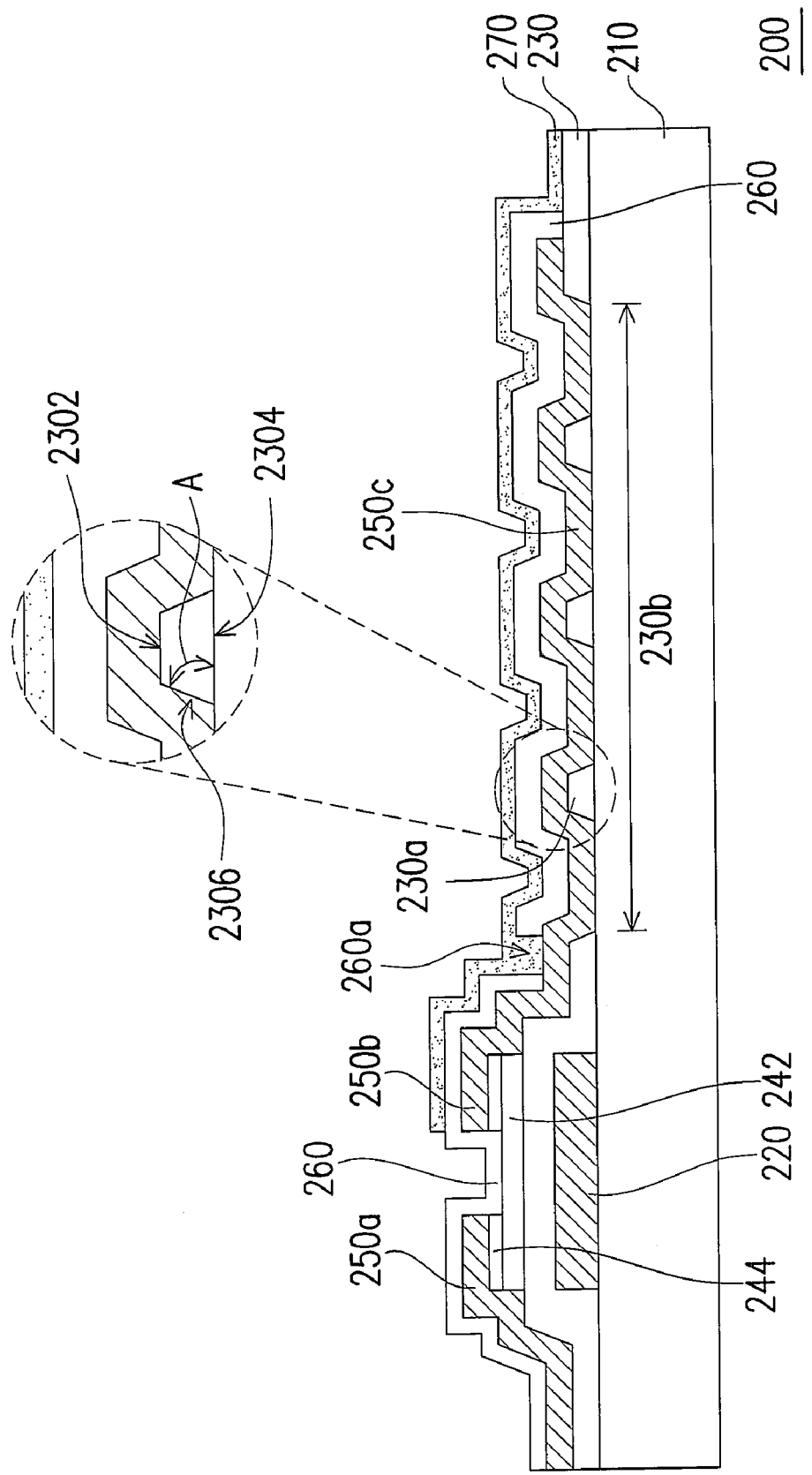

Referring to FIG. 2C, a second patterned dielectric layer 260 is formed on the first patterned dielectric layer 230. The second patterned dielectric layer 260 has a contact hole 260a to expose a portion of the drain 250b. Besides, the method for forming the second patterned dielectric layer may be a plasma enhanced chemical vapor deposition (PECVD) process performed below the temperature 300° C., for example. Afterwards, a transparent pixel electrode 270 is formed on the second patterned dielectric layer 260, and the transparent pixel electrode 270 is electrically connected with the drain 250b through the contact hole 260a. Up to this step, the fabricating process of the pixel structure 200 used in the transflective LCD device is substantially completed. The following further explains the structure of the pixel structure 200.

Referring still to FIG. 2C, the pixel structure 200 of the present embodiment includes a substrate 210, a gate 220, a first patterned dielectric layer 230, a semiconductor layer 242, an ohmic contact layer 244, a source 250a, a drain 250b, a reflective pixel electrode 250c, a second patterned dielectric layer 260 and a transparent pixel electrode 270. The gate 220 is disposed on the substrate 210. The first patterned dielectric layer 230 is disposed over the substrate 210 to cover the gate 220, and the first patterned dielectric layer 230 has a plurality of bumps 230a and at least one opening 230b. The bumps 230a are disposed on the substrate 210 exposed by the opening 230b. The semiconductor layer 242 is disposed on the first patterned dielectric layer 230 above the gate 220, and the source 250a and the drain 250b are disposed over the semiconductor layer 242. The reflective pixel electrode 250c is disposed on the first patterned dielectric layer 230 to cover the bumps 230a, and the reflective pixel electrode 250c is electrically connected with the drain 250b.

Referring to the locally magnified view in FIG. 2C, in order to increase the capacity of the reflective pixel electrode 250c to reflect light, each of the bumps 230a may have a top surface 2302, a bottom surface 2304 and at least a side surface 2306, and the side surface 2306 is connected with the top surface 2302 and the bottom surface 2304. For instance, each of the bumps 230a may be a prism or cylinder. Preferably, the width of each of the bumps 230a is gradually decreased from the bottom surface 2304 to the top surface 2302. Further, the distance from the top surface 2302 to the bottom surface 2304 of each of the bumps 230a may be between 2500 and 4000 angstroms, for example. The angle A between the side surface 2306 and the bottom surface 2304 of each of the bumps 230a may be between 10 and 15 degrees, for example. The width of the bottom surface 2304 of each of the bumps 230a may be between 3.5 and 5 microns, for example.

Moreover, the ohmic contact layer 244 is disposed between the semiconductor layer 242 and the source 250a, and between the semiconductor layer 242 and drain 250b. Besides, the second patterned dielectric layer 260 is disposed over the substrate 210, and covers the source 250a, the semiconductor layer 242 between the source 250a and the drain 250b, and a portion of the drain 250b. The second patterned dielectric layer 260 has a contact hole 260a to expose a portion of the drain 250b. The transparent pixel electrode 270 is disposed on the second patterned dielectric layer 260 and electrically connected with the drain 250b through the contact hole 260a.

More specifically, the substrate 210 may be a glass substrate, a quartz substrate or a substrate of other types. The structure of the gate 220, the source 250a, the drain 250b and the reflective pixel electrode 250c may be a single layer structure or a multilayer structure. Additionally, the material of the gate 220, the source 250a, the drain 250b and the reflective pixel electrode 250c may be aluminum (Al), molybdenum (Mo), molybdenum nitride (MoN), titanium (Ti), titanium nitride (TiN), chromium (Cr), chromium nitride (CrN) or other conductive materials. In the present embodiment, the structure of the gate 220, the source 250a, the drain 250b and the reflective pixel electrode 250c may be Al/Ti or Al/TiN. The thickness of an aluminum layer may be between 500 and 2000 angstroms, for example, and that of a titanium layer or a TiN layer may be between 300 and 1000 angstroms, for example.

In addition, the material of the first patterned dielectric layer 230 is $SiN_X$, $SiO_X$, $SiO_XN_Y$ or other insulating materials, and the thickness of the first patterned dielectric layer 230 may be between 1500 and 4000 angstroms, for example. The material of the semiconductor layer 242 is amorphous silicon or polysilicon, and that of the ohmic contact layer 244 may be doped amorphous silicon.

The material of the second patterned dielectric layer 260 is $SiN_X$, $SiO_X$, $SiO_XN_Y$ or other insulating materials, and the thickness of the second patterned dielectric layer 260 may be between 500 and 4000 angstroms, for example. Furthermore, the material of the transparent pixel electrode 270 is indium tin oxide (ITO), indium zinc oxide (IZO), aluminum zinc oxide (AZO) or other transparent conductive materials. And the thickness of the transparent pixel electrode 270 may be between 500 and 3000 angstroms, for example.

It is noted that the present embodiment does not require that an ohmic contact layer 244 be formed. Moreover, the pixel structure 200 of the present embodiment is used in the transflective LCD device, but a pixel structure without the transparent pixel electrode 270 may also be used in the reflective LCD device.

To sum up the above, the pixel structure of the present invention and the fabricating method thereof possess at least the advantages as follows.

1. Since the first patterned dielectric layer has bumps, which are covered by the reflective pixel electrode to form a bumping surface, the pixel structure of the invention has a better reflection rate. Furthermore, compared with the prior art, wherein bumps formed with a photo-resistant material are used, the first patterned dielectric layer having bumps is used to form the bumping surface in the present invention. Therefore, the pixel structure of the invention has better reliability.

2. Given that the reflective pixel electrode, the source and the drain are formed simultaneously, the fabricating method of the pixel structure of the invention is simpler than that of the prior art by comparison.

The fabricating method of the pixel structure in the invention is compatible with the existing processes so that no additional equipment is required.

Although the present invention has been disclosed above by the preferred embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A pixel structure, comprising:
    a substrate;
    a gate disposed on the substrate;
    a first patterned dielectric layer, disposed over the substrate to cover the gate, having a plurality of bumps and at least one opening, wherein the bumps are disposed on the substrate exposed by the opening;
    a semiconductor layer disposed on the first patterned dielectric layer above the gate;
    a source and a drain disposed over the semiconductor layer; and
    a reflective pixel electrode, disposed over the substrate to cover the bumps, electrically connected with the drain.

2. The pixel structure of claim 1, wherein each of the bumps has a top surface, a bottom surface and at least one side surface, wherein the side surface is connected with the top surface and the bottom surface.

3. The pixel structure of claim 2, wherein the width of at least one of the bumps is gradually decreased from the bottom surface to the top surface.

4. The pixel structure of claim 2, wherein the distance from the top surface to the bottom surface of at least one of the bumps is between 2500 and 4000 angstroms.

5. The pixel structure of claim 2, wherein the angle between the side surface and the bottom surface of at least one of the bumps is between 10 and 15 degrees.

6. The pixel structure of claim 2, wherein the width of the bottom surface of at least one of the bumps is between 3.5 and 5 microns.

7. The pixel structure of claim 1 further comprising:
    a second patterned dielectric layer disposed on the first patterned dielectric layer to cover the bumps, the source and the reflective pixel electrode, the second patterned dielectric layer having a contact hole exposing a portion of the drain; and
    a transparent pixel electrode disposed on the second patterned dielectric layer, the transparent pixel electrode being electrically connected with the drain through the contact hole.

8. The pixel structure of claim 1 further comprising an ohmic contact layer disposed between the semiconductor layer and the source and between the semiconductor layer and the drain.

9. A fabricating method of the pixel structure comprising:
providing a substrate;
forming a gate on the substrate;
forming a first patterned dielectric layer over the substrate to cover the gate, the first patterned dielectric layer having a plurality of bumps and at least one opening, wherein the bumps are disposed on the substrate exposed by the opening;
forming a semiconductor layer on the first patterned dielectric layer, wherein the semiconductor layer is disposed on the first patterned dielectric layer over the gate; and
forming a source, a drain and a reflective pixel electrode over the first patterned dielectric layer, wherein a portion of the semiconductor layer is covered by the source and the drain, the reflective pixel electrode being electrically connected with the drain and covering the bumps.

10. The fabricating method of claim 9, further comprising:
after the source, the drain and the reflective pixel electrode being formed, forming a second patterned dielectric layer on the first patterned dielectric layer, wherein the second dielectric layer covers the bumps, the source and the reflective pixel electrode, the second patterned dielectric layer having a contact hole exposing a portion of the drain; and
forming a transparent pixel electrode on the second patterned dielectric layer, the transparent pixel electrode being electrically connected with the drain through the contact hole.

11. The fabricating method of claim 9, wherein forming the semiconductor layer comprises:
forming a semiconductor material layer on the first patterned dielectric layer; and
patterning the semiconductor material layer to form the semiconductor layer.

12. The fabricating method of the pixel structure of claim 11, further comprising:
after the semiconductor material layer being formed, forming an ohmic contact material layer on the semiconductor material layer.

* * * * *